United States Patent
Fournel et al.

(10) Patent No.: US 10,818,500 B2
(45) Date of Patent: Oct. 27, 2020

(54) METHOD FOR WAFER TRIMMING

(71) Applicant: Commissariat A L'Energie Atomique et aux Energies Alternatives, Paris (FR)

(72) Inventors: Franck Fournel, Villard-Bonnot (FR); Christophe Morales, St Pierre de Mesage (FR); Marc Zussy, Saint Egreve (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/228,845

(22) Filed: Dec. 21, 2018

(65) Prior Publication Data
US 2019/0206693 A1 Jul. 4, 2019

(30) Foreign Application Priority Data
Dec. 22, 2017 (FR) ...................... 17 63150

(51) Int. Cl.
| H01L 21/304 | (2006.01) |
| H01L 21/762 | (2006.01) |
| H01L 21/66 | (2006.01) |
| H01L 21/02 | (2006.01) |
| B24B 37/013 | (2012.01) |
| B24B 9/06 | (2006.01) |

(52) U.S. Cl.
CPC ............ *H01L 21/304* (2013.01); *B24B 9/065* (2013.01); *B24B 37/013* (2013.01); *H01L 21/02087* (2013.01); *H01L 21/76251* (2013.01); *H01L 22/26* (2013.01)

(58) Field of Classification Search
None
See application file for complete search history.

(56) References Cited

U.S. PATENT DOCUMENTS

| 2011/0183495 A1 | 7/2011 | Sousbie et al. |
| 2011/0230003 A1* | 9/2011 | Vaufredaz ......... H01L 21/76256 438/67 |
| 2014/0042595 A1 | 2/2014 | Schulze et al. |
| 2014/0252563 A1 | 9/2014 | Schulze et al. |

FOREIGN PATENT DOCUMENTS

EP    2 348 527 A1    7/2011

OTHER PUBLICATIONS

French Preliminary Search Report dated Nov. 5, 2018 in French Application 17 63150, filed on Dec. 22, 2017 (with English translation of categories of cited documents & Written Opinion).

* cited by examiner

*Primary Examiner* — Bo B Jang
(74) *Attorney, Agent, or Firm* — Oblon, McClelland, Maier & Neustadt, L.L.P.

(57) ABSTRACT

The invention aims for a wafer edge trimming method 1 adhered on a support wafer 2 by way of an interface layer 3. A zone at the perimeter 12 of the wafer 1 is trimmed by grinding. The stopping of the grinding is advantageously done at the level of the interface layer 3. To do this, an interface layer 3 comprising a transition layer 4 having a resistance to grinding greater than that of the wafer 1 is used. According to a possibility, detecting an increase of the resistance to grinding during the grinding is done, so as to stop the grinding.

13 Claims, 4 Drawing Sheets

METHOD FOR WAFER TRIMMING

TECHNICAL FIELD OF THE INVENTION

The invention relates to the field of microtechnologies and microelectronics. It has a particularly advantageous application in the trimming of wafers for microelectronics.

STATE OF THE ART

In the field of microelectronics, the wafers used as substrates can be produced by way of layer adhesion and/or layer transfer steps.

For example, a "Silicon On Insulator" (SOI) type substrate can be produced from a molecular adhesion production method, also called direct adhesion.

According to this direct adhesion method, the surface of a first silicon dioxide layer on a first silicon wafer, is put into contact with the surface of a second silicon dioxide layer on a second silicon wafer, after preparation of the surfaces. A suitable heat treatment is carried out so as to secure the two wafers at the level of the oxide layers in contact.

A thinning of the first silicon layer is then achieved by chemical-mechanical grinding and/or polishing, so as to form an SOI type substrate.

However, during the direct adhesion, zones at the periphery of the wafers remain non-adhered. These zones at the periphery are therefore fragile and likely to be broken in a non-controlled manner during the thinning. These zones at the periphery can thus be a specific contamination source of the SOI substrate.

To overcome this problem, the zones at the periphery of the wafer to be thinned are generally removed beforehand by a trimming method.

The trimming method can consist of mechanically machining the edge of the wafer to be thinned fixed on the support wafer. However, it is difficult to machine the wafer to be thinned without affecting or damaging the support wafer. Indeed, the interface between the two adhered wafers is generally thin and it is often impossible to control the stopping of the machining according to a machining depth, sufficiently precisely.

Thus, to completely remove the zones at the periphery of the wafer to be thinned, the trimming by mechanical machining generally leads to also trimming a part of the support wafer over a low depth, as illustrated in document WO 1996017377 A1, for example.

A disadvantage of this method is that the support wafer, partially machined from the trimming, cannot be reused.

Another major disadvantage of this method is the specific contamination source generated by the partial machining of the support wafer.

Alternatively, the trimming can be achieved by photolithography and deep etching techniques. Such a trimming method by physico-chemical machining is however slow and expensive.

An aim of the present invention is to overcome the disadvantages of the trimming methods mentioned above.

In particular, an aim of the present invention is to propose a wafer edge trimming method adhered on a support wafer, limiting, even negating a specific contamination coming from the support wafer.

SUMMARY OF THE INVENTION

To achieve this aim, the present invention provides a wafer edge trimming method having a first face and a second face opposite the first face, the method comprising at least the following steps:

Fixing the wafer on a support by means of a layer, called interface layer, situated between the wafer and the support, at the level of the first face, Trimming a zone at the perimeter of the wafer by grinding from the second face and in the direction of the interface layer, Stopping the trimming after removal of the zone at the perimeter at the end of a total grinding time $t_{tot}$.

Advantageously, an interface layer comprising a layer, called transition layer, situated at least to the right of the zone at the perimeter of the wafer and having a resistance to grinding greater than that of the wafer, is used, and the stopping of the trimming is done in said transition layer.

The use of a transition layer having a greater resistance to grinding, and preferably at least five times greater, to that of the wafer to be trimmed, advantageously makes it possible to stifle a progression of the grinding through the interface layer. It is subsequently possible to stop the trimming in the interface layer, even in the transition layer.

The method proposed by the present invention thus makes it possible to avoid a specific contamination source coming from the support, by protecting the support vis-à-vis the grinding.

The support wafer thus preserved can furthermore be advantageously reused, for other applications or for trimming another wafer.

According to an advantageous possibility, the stopping of the trimming is done after detection of a variation in resistance to grinding. This variation in resistance is indeed due to the presence of the transition layer, and indicates that the grinding has reached said transition layer.

BRIEF DESCRIPTION OF THE FIGURES

The aims, objectives, as well as the characteristics and advantages of the invention will emerge best from the detailed description of embodiments of the latter, which are illustrated by the following supporting drawings, wherein.

Figure 1A:
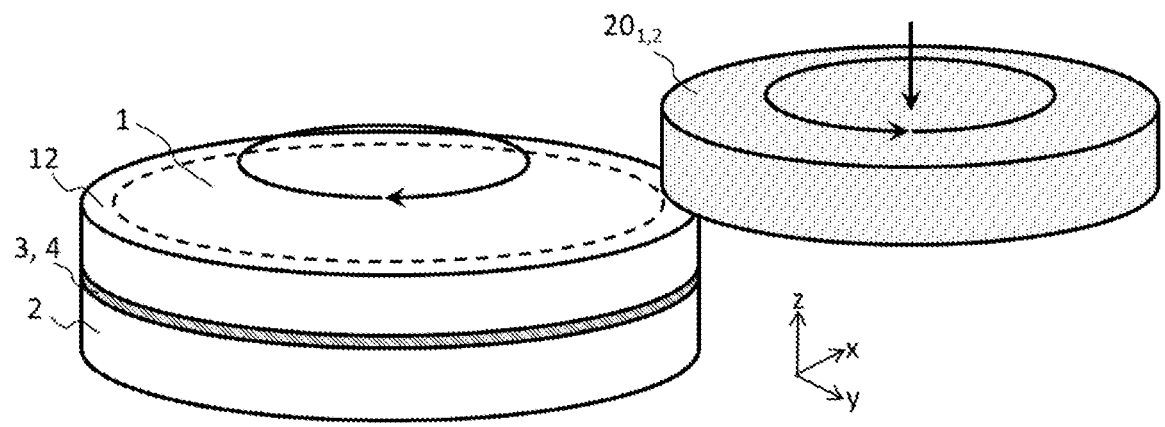
FIG. 1A illustrates an initial state of the trimming method according to an embodiment of the invention, in the process of production.

The drawings are given as examples and are not limiting of the invention. They constitute schematic representations of principle intended to facilitate the understanding of the invention and are not necessarily to the scale of the practical applications. In particular, the relative thicknesses of the different layers and wafers are not representative of reality.

DETAILED DESCRIPTION OF THE INVENTION

Before starting a detailed review of embodiments of the invention, below are stated optional characteristics which can possibly be used in association or alternatively:

The transition layer is selected made of a material taken from among: silicon oxide, alumina, diamond, silicon nitride.

The transition layer is selected to have a thickness of between 0.5 µm and 10 µm.

The wafer is selected made of at least one material taken from among: silicon, germanium, a III/V material, a II/VI material, silicon carbide (SiC).

The total grinding time $t_{tot}$ is selected such that $t_{tot}=t_1+t_2$, $t_1$ being a first grinding time corresponding to a grinding of the zone at the perimeter of the wafer and $t_2$ being a second grinding time corresponding to a partial grinding of the transition layer, where $t_2 \neq 0$, such that the stopping of the trimming at the end of the total grinding time $t_{tot}$ is done in said transition layer.

According to a particularly advantageous embodiment for the stopping of the trimming by detecting a variation in resistance to grinding, in particular in the case of a trimming done according to a setpoint imposing a given grinder descent speed:

The variation in resistance to grinding is detected as an increase of one from among a nominal amperage and a nominal torque of the motor of a grinder.

The increase in amperage of the motor is an increase of at least 30% of the nominal amperage during grinding.

Such an increase in nominal amperage of in the nominal torque of the motor of the grinder indicates that the grinder has reached the transition layer. The detection of this increase makes it possible to control the stopping of the trimming.

According to another particularly advantageous embodiment for stopping the trimming by detecting a variation in resistance to grinding, in particular in the case of a trimming done according to a setpoint imposing a given grinder motor torque:

The variation in resistance to grinding is detected as a decrease of a nominal descent speed of a grinder.

The decrease of descent speed is a decrease of at least 50% of the nominal descent speed during grinding.

Such a decrease of descent speed of the grinder also indicates that the grinder has reached the transition layer. The detection of this decrease makes it possible to control the stopping of the trimming. The decrease of speed can be measured from the position of the grinder. As soon as the grinder stops progressing the contact of the transition layer, the descent speed thereof suddenly decreases.

According to an alternative embodiment to the preceding embodiments:

The total time $t_{tot}$ is determined by increasing by a factor $k_1$ of a predictable grinding time $t_{pred}$ such that $t_{tot}=k_1 \cdot t_{pred}$, with $1.1<k_1<3$, said predictable time being predicted according to at least one removal rate of the material of the zone at the perimeter so as to remove a total thickness $e_{tot}$ of said zone at the perimeter.

The stopping of the trimming is thus advantageously programmed without it being necessary to detect a passage of the grinder at the level of the transition layer. The transition layer furthermore has a resistance to sufficient grinding to prevent a grinding of the support wafer in such a case where the grinding is extended beyond the time necessary to remove the zone at the perimeter over all of the thickness thereof.

According to an advantageous embodiment, compatible with the preceding embodiments, but only optional:

The trimming comprises a first grinding step configured to remove a first part of the zone at the perimeter with a removal rate of between 10 µm·min$^{-1}$ and 100 µm·min$^{-1}$, said first part comprising at least 90%, preferably at least 95%, even 97%, of the zone at the perimeter, and a second grinding step succeeding the first grinding step and configured to remove a second part of the zone at the perimeter with a removal rate of between 1 µm·min$^{-1}$ and 10 µm·min$^{-1}$.

Complementarily, the first grinding step can be carried out on a width $L_1$ taken from an edge of the zone at the perimeter, and the second grinding step is carried out on a width $L_2$ taken from said edge of the zone at the perimeter, such that $L_1 > L_2$.

This embodiment makes it possible to minimise the total grinding time by resorting to a first quick grinding step.

According to an embodiment, alternative to the preceding complement, the first grinding step is carried out on a width $L_1$ taken from an edge of the zone at the perimeter, and the second grinding step is carried out on a width $L_2$ taken from said edge of the zone at the perimeter, such that $L_1 < L_2$.

This embodiment makes it possible to obtain a substantially vertical trimming edge of the wafer, by avoiding creating a step or a stand at the level of the trimming edge after the first grinding step.

The widths $L_1$ and $L_2$ are of between 1 mm and 5 mm.

According to a particularly advantageous embodiment, and compatible with the preceding embodiments:

The trimming method further comprises, after the stopping of the trimming, a step of cleaning by etching so as to remove a possibly remaining part of the zone at the perimeter.

The etching can be a wet etching such as, for example, an etching in a tetramethylammonium hydroxide (TMAH)-based solution at a temperature of between 70° C. and 90° C. for an etching time of between 5 minutes and 15 minutes.

This wet etching has a good Si/SiO$_2$ selectivity. It can therefore be used, in particular, for the trimming of a silicon wafer and for an SiO$_2$ transition layer.

In an alternative, the etching can be a dry etching such that, for example, a sulphur hexafluoride (SF$_6$)-based plasma etching for an etching time of between 5 minutes and 15 minutes.

This dry etching has a good Si/SiO$_2$ selectivity. It can therefore be used, in particular, for the trimming of a silicon wafer and for an SiO$_2$ transition layer.

It is specified that, in the scope of the present invention, the trimming is done by grinding. This trimming is therefore a purely mechanical removal or thinning method, contrary to a chemical-mechanical polishing (CMP) method. A chemical-mechanical polishing method indeed combines chemical and mechanical actions, by generally mixing a free abrasive with a wet etching solution.

The grinding, in the scope of the present invention, is implemented without adding any free abrasive, nor adding any chemical etching solution.

A purely mechanical grinding method is therefore distinguished from the CMP-type methods.

Below, the terms "trimming", "grinding" and "machining by abrasion" are synonymous.

The grinding consists of abrading a material by friction with sharp grains or particles agglomerated by a binding agent at least at the surface of a tool. In particular, a diamond wheel rotated on a grinder makes it possible to carry out such a machining by abrasion.

The grinding can be assisted by a water flow so as to limit a heating of the materials by friction, and/or so as to cart, by a physical action, abraded material particles. This water flow is not intended to assist the grinding by a chemical action.

The resistance to the abrasion of a material A can depend on the type of abrasive material B and the type of binding agent, different friction movements on the surface of the material A, of the inner stress of the material A, and of the contact pressure between the abrasive material B and the material A, in particular.

The resistance to the abrasion of the material A can be evaluated through a removal rate of this material A, from fixed grinding parameters, such as the grain size of the abrasive material B, the type of binding agent, a rotation speed of the grinding wheel, and a pressure applied to the material A by said wheel, for example.

By a film, this means a material A "-based" layer, a film, a layer comprising this material A only or this material A and possibly other materials, for example alloy elements, impurities or doping elements.

In the present patent application, the thickness is taken along a direction perpendicular to the main faces of the wafers in contact. In the figures, the thickness is taken along the axis z of the orthonormal markers xyz.

In reference to FIGS. 1A, 1B, 1C, and 4, the trimming method 100 according to the invention relates to the trimming of a wafer to be thinned 1 fixed 110 on a support wafer 2 by way of an interface layer 3. The stack comprising the wafer 1 to be thinned, the interface layer 3 and the support wafer 2 can be called "substrate".

The wafer to be thinned 1 can be fixed 110 by direct adhesion on the support wafer 2.

A first example of direct adhesion between a first wafer and a second wafer is described below.

The first wafer, for example, the wafer to be thinned 1, is a silicon wafer having a thickness of 775 µm, thermally oxidised at least on one face so as to form an oxide layer, 1 µm thick.

The second wafer, for example, the support wafer 2, is a silicon wafer, 775 µm thick, thermally oxidised at least on one face so as to form an oxide layer, 1 µm thick.

Then, a step of preparing the surface of the first and second wafers, comprising for example a cleaning and a hydrolysis, can be carried out. Such a cleaning can be carried out, for example, in an ozone-enriched deionised water bath. Such a hydrolysis can be carried out, for example, in an ammonium peroxide mixture (APM) at 70° C.

After preparing the surfaces, the face comprising the oxide of the first wafer is put into contact with the face comprising the oxide of the second wafer, at ambient temperature and pressure.

An annealing at 1200° C. for two hours can then be done so as to finalise the direct adhesion by molecular adhesion.

A second example of direct adhesion between a first wafer and a second wafer is also described below.

The first wafer, for example, the wafer to be thinned 1, is a silicon wafer, 775 µm thick, comprising microelectronic devices on a face. An oxide deposition, for example by chemical vapour deposition (CVD) from a TEOS (tetraethyl orthosilicate) precursor, is done on said face so as to form an oxide layer, 5 µm thick.

The second wafer, for example the support wafer 2, is a silicon wafer, 775 µm thick, possibly comprising microelectronic devices on a face. An oxide deposition, for example by CVD from a TEOS precursor, is done on said face so as to form an oxide layer, 5 µm thick.

Then, a step of preparing the surface of the first and second wafers, similar to that described in the first preceding example can be carried out.

After preparing the surfaces, the face comprising the oxide of the first wafer is put into contact with the face comprising the oxide of the second wafer, at ambient temperature and pressure.

An annealing at 400° C. for two hours can then be done so as to finalise the direct adhesion by molecular adhesion. This temperature makes it possible to not damage the present microelectronic devices.

In these examples of direct adhesion, the interface layer 3 comes from the oxide layers of the first and second wafers.

The wafer to be thinned 1 can subsequently extend from a part of the first wafer excluding the interface layer 3.

Below, the wafer to be thinned 1 is also called an upper wafer or simply wafer 1.

After adhesion, the free face of the upper wafer 1 is called upper face.

The wafer to be thinned 1 can be made of a material taken from among: silicon, germanium, a III/V material, a II/VI material, SiC. This list is however not exhaustive.

Figure 1B:
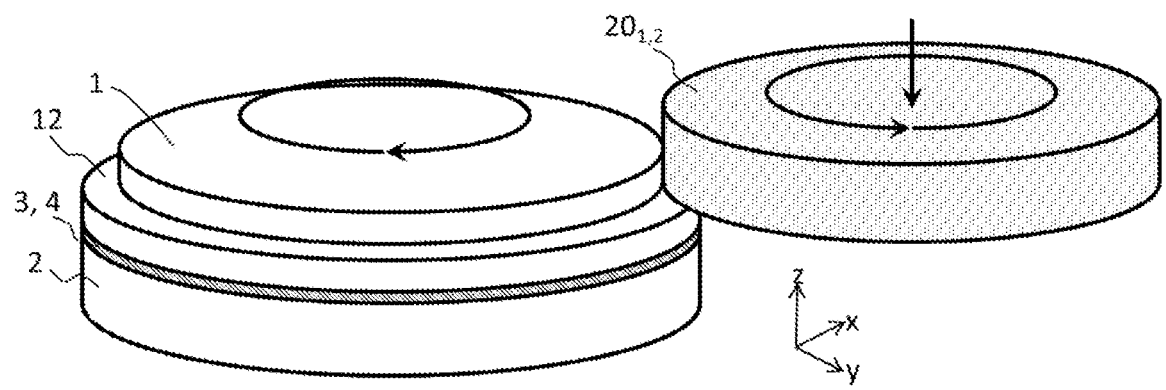
FIG. 1B shows a progression of the trimming method according to an embodiment of the invention illustrated in FIG. 1A.
Figure 1C:
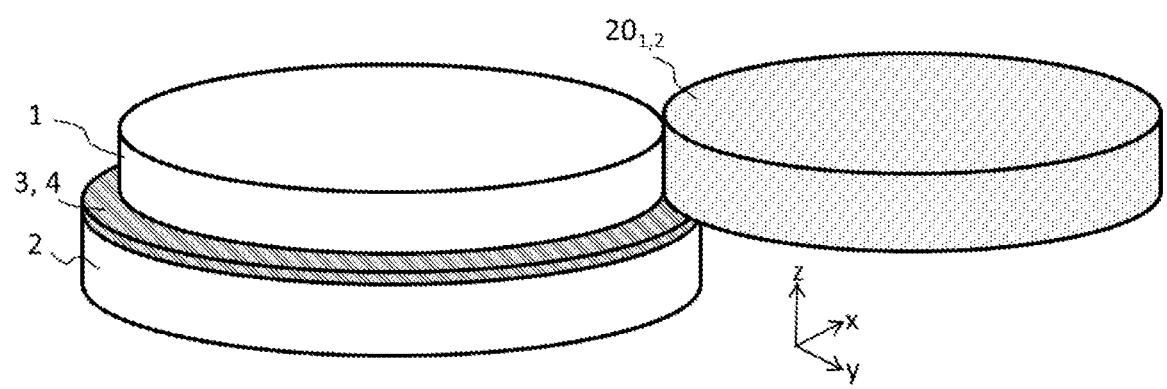
FIG. 1C shows the trimming method according to an embodiment of the invention illustrated in FIG. 1A, in the process of finalisation.
Figure 2A:
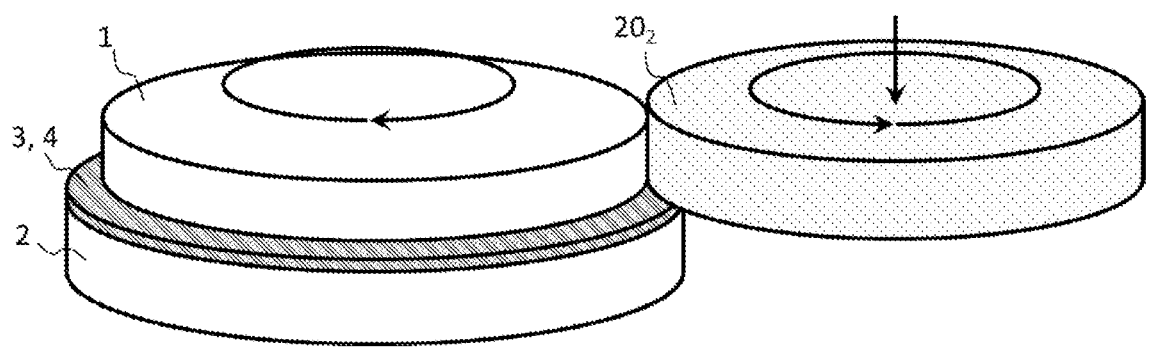
FIG. 2A illustrates a trimming method according to a first embodiment of the invention.
Figure 2B:
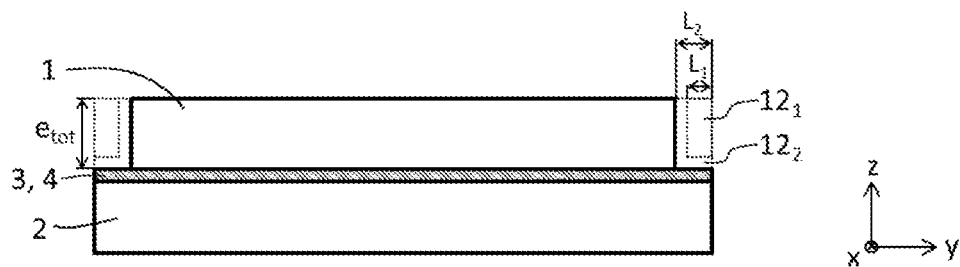
FIG. 2B shows a cross-sectional view of a substrate obtained from the trimming method according to the first embodiment of the invention illustrated in FIG. 2A.
Figure 3A:
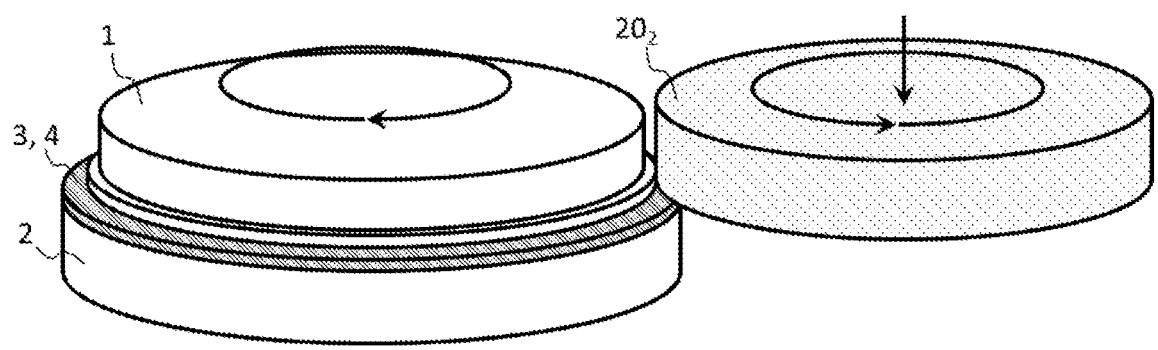
FIG. 3A illustrates a trimming method according to a second embodiment of the invention.
Figure 3B:
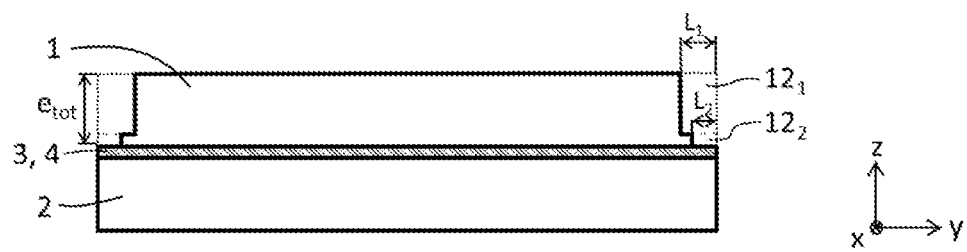
FIG. 3B shows a cross-sectional view of a substrate obtained from the trimming method according to the second embodiment of the invention illustrated in FIG. 3A.
Figure 4:
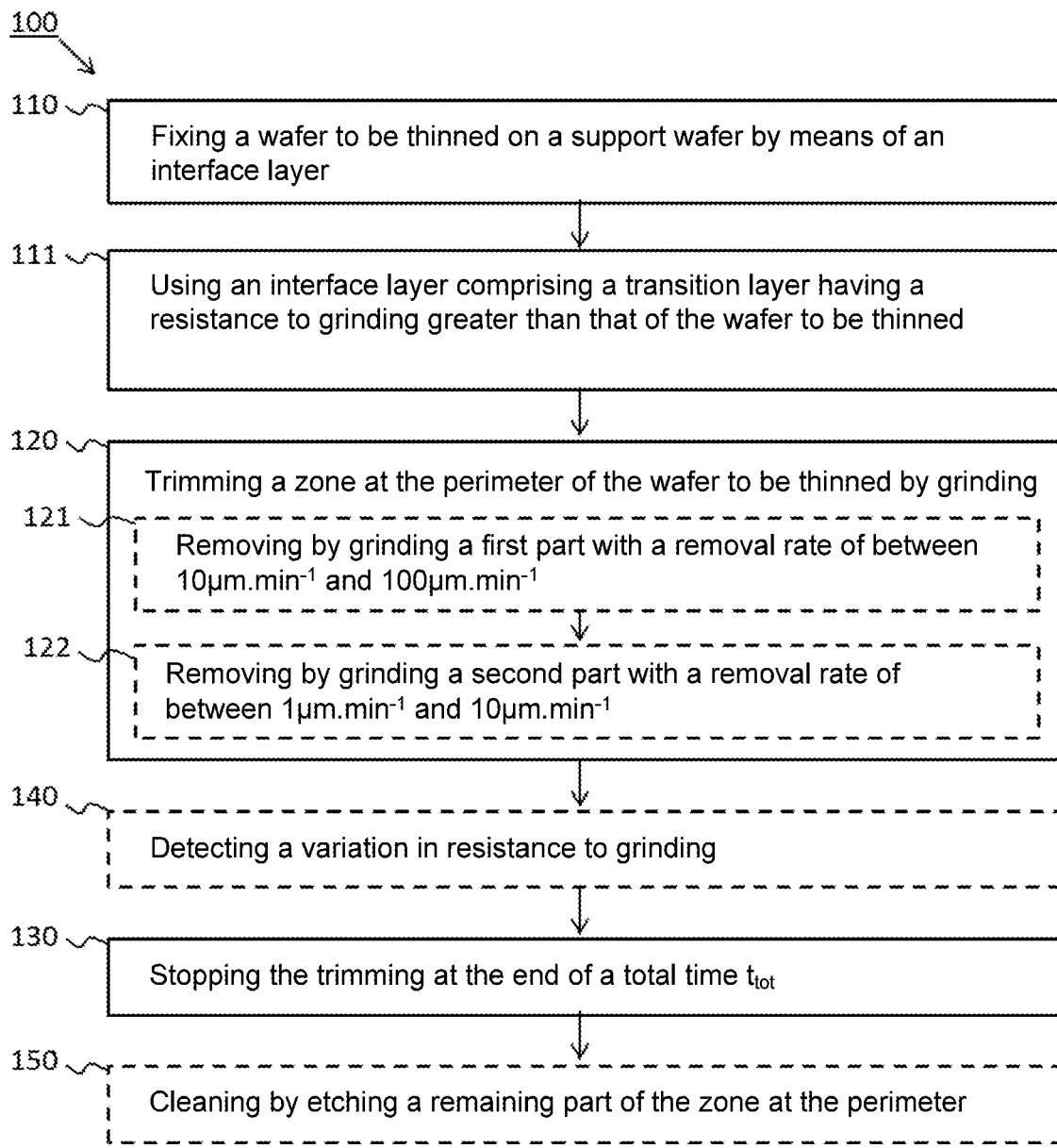
FIG. 4 shows a diagram of the method illustrating steps of a trimming method according to an embodiment of the invention.

Such as illustrated in FIGS. 1A, 1B and 1C, the trimming of the wafer 1 is done preferably by means of a grinder comprising at least one diamond wheel $20_1$, $20_2$.

A trimming 120, or grinding, of a zone at the perimeter 12 of the upper wafer 1 is done.

Such a grinding 120 can comprise, for example, the following steps:

The adhered wafers 1, 2 and the diamond wheel $20_1$, $20_2$ are respectively rotated along the preferably opposite directions of rotation, such as illustrated by the arrows in the figures.

The diamond wheel $20_1$, $20_2$ is approached from the upper face of the wafer 1, so as to obtain a cover, projected in a plane xy, on a width, $L_1$ or $L_2$, taken from an edge of the wafer 1.

A force, illustrated by a vertical arrow in the figures, is then applied to the wheel along the direction z, so as to grind 120 progressively the zone at the perimeter 12, by vertically moving the grinder from the upper face in the direction of the interface layer 3.

The zone at the perimeter 12 can be substantially annular and can have a width $L_1$, $L_2$, taken radially, of between 1 mm and 5 mm.

The thickness of this zone at the perimeter 12 is preferably equal to the total thickness $e_{tot}$ of the upper wafer 1.

The trimming method 100 aims to remove the zone at the perimeter 12 over all of the thickness thereof.

To do this, according to an embodiment of the method 100 partially illustrated in FIGS. 2A, 2B and 3A, 3B, the trimming 120 comprises a first grinding step 121 and a second grinding step 122 succeeding the first grinding step 121.

The first grinding step 121 is configured to remove a first part $12_1$ of the zone at the perimeter 12 on a width $L_1$ with, as a setpoint, a first removal rate. The first part $12_1$ comprises at least 90%, preferably at least 97%, of the zone at the perimeter 12.

The second grinding step 122 is configured to remove a second part $12_2$ of the zone at the perimeter 12 on a width $L_2$ with, as a setpoint0, a second removal rate lower than the first removal rate.

The first removal rate can be typically of between 10 µm·min$^{-1}$ and 100 µm·min$^{-1}$, and the second removal rate can be typically of between 1 µm·min$^{-1}$ and 10 µm·min$^{-1}$.

The first grinding step 121 thus makes it possible to quickly grind a major part $12_1$ of the zone at the perimeter 12, the remaining part $12_2$ being ground 122 more slowly at the approach of the interface layer 3.

The first and second grinding steps 121, 122 cumulate a total grinding time $t_{tot}$.

The first grinding step 121 is, for example, carried out by a first grinder, for example of the brand Okamoto, model 254B 3W5X J 75BA 325 40SB8, with a diamond wheel $20_1$ having a grain size 16000/325 µm, on a width $L_1$ of 3 mm at the perimeter of the wafer 1.

This first step 121 is stopped when the wheel $20_1$ reaches a distant vertical portion of around 20 µm of the interface layer 3.

A second grinding step 122 can thus be carried out by a second grinder, for example of the brand Okamoto, model 254B 3W5X J 75BA 2000 40SB8, with a diamond wheel $20_2$ having a grain size, finer than that of the preceding step, typically 16000/2000 µm, on a width $L_2$ at the perimeter of the wafer 1.

The width $L_2$ can be equal to $L_1$, or comprised in an interval $L_1 \pm 0.1$ mm.

Advantageously, the width $L_2$ will be slightly less than $L_1$, for example, of between $L_1$-0.01 mm>$L_2$>$L_1$-0.1 mm, to minimise the total grinding time and/or to avoid a too large consumption of diamond wheels $20_2$ with fine grains.

The trimming method 100 also aims to stop the grinding 120 at the level of the interface layer 3.

To do this, an interface layer 3 comprising a transition layer 4 having a resistance to grinding, or a resistance to abrasion, greater than that of the wafer 1 is advantageously used 111.

The transition layer 4 preferably has a thickness lower than or equal to that of the interface 3.

It can extend along the whole surface of the interface layer 3. Alternatively, it can extend over a zone underlying the zone at the perimeter 12, for example annular.

The transition layer 4 can advantageously fully constitute the interface layer 3.

This transition layer 4 can have a resistance to abrasion at least three or five times greater and preferably at least ten times greater, to that of the wafer 1.

The resistance to abrasion of the transition layer 4 and the resistance to abrasion of the wafer 1 can be evaluated from the removal rates of the materials respectively constituting the transition layer 4 and the wafer 1, for a fixed clearance of grinding parameters.

This parameter clearance in particular comprises a grain size of the abrasive material, a rotation speed of the grinding wheel, a pressure applied to the material to be ground, and optionally a rotation speed of the support on which is fixed the material to be ground and a direction of rotation of said support relatively to the direction of rotation of the wheel.

For example, a grinding of a zone at the perimeter 12 made of silicon done by a diamond wheel $20_2$ having a grain size 16000/2000 µm, at a rotation speed of the wheel $20_2$ of 2000 tr·min$^{-1}$ makes it possible to abrade the silicon with a removal rate of between 10 µm·min$^{-1}$ and 20 µm·min$^{-1}$.

A grinding of an underlying zone (to the zone at the perimeter 12) made of silicon oxide done under the same conditions as the grinding of the zone at the perimeter 12 made of silicon, makes it possible to abrade the silicon oxide with a removal rate of between 0.05 µm·min$^{-1}$ and 0.1 µm·min$^{-1}$.

For a wafer to be thinned 1 made of silicon, an interface layer 3 comprising a transition layer 4 made of silicon oxide can therefore advantageously be used 111, so as to significantly stifle the grinding at the level of the transition layer 4.

The stopping 130 of the grinding or of the trimming can be done in the transition layer 4 at the end of a total grinding time $t_{tot}$ greater than a first grinding time $t_1$ corresponding to the grinding of the zone at the perimeter 12 over all the thickness thereof.

The total grinding time $t_{tot}$ can thus be fixed such that: $t_{tot}=t_1+t_2$, with $t_2 \neq 0$, $t_2$ being a second grinding time corresponding to the partial grinding of the transition layer 4.

For a grinding with a rough diamond wheel $20_1$ then a finer diamond wheel $20_2$, comprising a first and a second grinding step 121, 122, with $L_2<L_1$, the first grinding time $t_1$ preferably corresponds only to the grinding of the zone at the perimeter 12 during the second grinding step 122. This first time $t_1$ subsequently corresponds to the grinding of the thickness of a residual zone of the zone at the perimeter 12 after the first grinding step 121.

Advantageously, the removal rate in the transition layer 4 is a lot less, preferably less than at least one order of magnitude, than the removal rate in the perimeter zone 12.

Thus, it is not necessary to very precisely control the first grinding time $t_1$ to avoid grinding the interface layer 3 on all of the thickness thereof and in particular to avoid grinding an underlying part of the support wafer 2.

The transition layer 4 makes it possible to protect the support wafer 2 opposite the grinding, at least during the second time $t_2$.

The support wafer 2 can therefore be advantageously reused, after trimming and removing the wafer 1, for the trimming of another wafer, for example.

The first grinding time $t_1$ can be simply estimated, according to an abacus or by calibration for example, and increased by a coefficient $k_1$ such that:

$$t_{tot}=t_1+t_2=k_1 \cdot t_1.$$

For a grinding with a rough diamond wheel $20_1$ then a finer diamond wheel $20_2$, $k_1$ is preferably selected, such that $2<k_1<3$. The residual zone, of which the thickness corresponds, preferably, to around 3% of the total thickness of the zone at the perimeter 12 coming from the first grinding step 121, can thus be totally ground during the second grinding step 122.

The second grinding time $t_2$ is preferably strictly less than a grinding time $t_{2tot}$ corresponding to the grinding of the transition layer 4 on all of the thickness thereof.

Such that this grinding time $t_{2tot}$ is at least a few tens of seconds, the selection of the type and of the thickness of the transition layer 4 is particularly significant.

The transition layer 4 is preferably selected from a material taken from among: a silicon oxide, alumina, diamond and silicon nitride.

The transition layer 4 is preferably selected with a thickness of between 0.5 µm and 10 µm.

According to a particularly advantageous embodiment of the method 100, a detection 140 of a variation in resistance to grinding is done to trigger the stopping 130 of the grinding.

The variation in resistance to grinding is indeed induced by a start of abrasion of the transition layer 4. The resistance to grinding increases by passing from the zone at the perimeter 12 to the transition layer 4.

This increase in resistance to grinding can in particular generate an increase of an amperage of the motor of the grinder, if the grinding is done according to a fixed descent grinder speed.

For example, during a transition of the grinding between the zone at the perimeter 12 made of silicon and the underlying zone made of silicon oxide, the amperage of the motor can pass from 7 A to 11 A.

By monitoring this amperage and by detecting 140 this increase of amperage during the grinding 120, it is possible to identify a moment when the diamond wheel 20₂ reaches or has reached the transition layer 4.

Alternatively, if the grinding is done at a given motor amperage, the increase of resistance to grinding can generate a decrease of descent speed of the grinder. By detecting 140 this descent speed decrease, it is also possible to identify the moment when the diamond wheel 20₂ reaches or has reached the transition layer 4.

Subsequently, the stopping 130 of the grinding can be immediate or delayed.

By delaying the stopping 130 of the grinding, the material of the wafer 1 can be totally removed in the zone at the perimeter 12 purely mechanically.

By stopping 130 the grinding at the moment when the diamond wheel 20₂ reaches the transition layer 4, a part of the material of the wafer 1 can subsist in the zone at the perimeter 12. This solution can be selected, in particular, in the case of a thin transition layer 4, in order to ensure the protection of the support wafer 2.

An optional cleaning step 150 can be carried out so as to remove the remaining material in the zone at the perimeter 12.

This cleaning 150 can be a wet or dry etching, of the remaining material.

The etching of the material of the wafer 1 preferably has a good selectivity $S_{mat1/mat4}$ vis-à-vis the material of the transition layer 4. This selectivity is, for example, greater than 5:1.

For example, in the case of a wafer 1 made of silicon and of a transition layer 4 made of silicon oxide, a wet etching in a 12% TMAH-based solution, at a temperature of 80° C. for an etching time of 10 minutes can be done so as to remove the remaining silicon in the zone at the perimeter 12. In this case, the selectivity between silicon and thermal silicon oxide $S_{Si/SiO2}$ is greater than 500:1.

Alternatively, an SF₆-based plasma dry etching, for an etching time of 10 minutes, can be done.

The selectivity $S_{Si/SiO2}$ can be, in this case, greater than 10:1.

In view of the description above, it clearly appears that the invention proposes a particularly reliable and effective wafer edge trimming method adhered on a support wafer by limiting, even by negating, any risk of specific contamination coming from the support wafer.

The invention is not limited to the embodiments described above and extends to all embodiments covered by the claims.

The invention claimed is:

1. A wafer edge trimming method, the wafer having a first face and a second face opposite the first face, said method comprising:
   fixing the wafer on a support by means of an interface layer, the interface layer positioned between the wafer and the support, at the first face of the wafer,
   trimming a zone at a perimeter of the wafer by grinding from the second face of the wafer in a direction of the interface layer,
   stopping the trimming after removal of the zone at the perimeter of the wafer at an end of a total time $t_{tot}$,
   wherein the interface layer includes a transition layer, the transition layer having a top surface facing in a direction of the first face of the wafer, the transition layer being situated below the zone at the perimeter of the wafer, the transition layer has a resistance to grinding greater than that of the wafer,
   wherein the stopping of the trimming is done in said transition layer based on a detection of a variation in resistance to grinding.

2. The trimming method according to claim 1, wherein the resistance to grinding of the transition layer is at least five times greater than the resistance to grinding of the wafer.

3. The trimming method according to claim 1, wherein the total grinding time $t_{tot}$ is selected such that $t_{tot}=t_1+t_2$, $t_1$ being a first grinding time corresponding to a grinding of the zone at the perimeter of the wafer and $t_2$ being a second grinding time corresponding to a partial grinding of the transition layer, where $t_2 \neq 0$, such that the stopping of the trimming is clone in said transition layer.

4. The trimming method according to claim 1, wherein the variation in resistance to grinding is detected as an increase of one among a nominal amperage of a motor of a grinder and a nominal torque of the motor of the grinder.

5. The trimming method according to claim 1, wherein the variation in resistance to grinding is detected as a decrease of a nominal descent speed of a grinder.

6. The trimming method according to claim 1, wherein the total grinding time$_{tot}$ is determined by increasing by a factor $k_1$ of a predictable grinding time $t_{pred}$ such that $t_{tot}=k_1 \cdot t_{pred}$, with $1.1<k_1<3$, said predictable grinding time being predicted according to at least one removal rate of a material of the zone at the perimeter and said predictable grinding time being selected so as to remove a total thickness $e_{tot}$ of the zone at the perimeter.

7. The trimming method according to claim 1, wherein the trimming comprises a first grinding step configured to remove a first part of the zone at the perimeter with a removal rate of between 10 µm·min⁻¹ and 100 µm·min⁻¹, said first part comprising at least 90%, of the zone at the perimeter, and a second grinding step succeeding the first grinding step and configured to remove a second part of the zone at the perimeter with a removal rate of between 1 µm·min⁻¹ and 10 µm·min⁻¹.

8. The trimming method according to claim 7, wherein the first grinding step is carried out on a region having a width $L_1$ taken from an edge of the zone at the perimeter, and the second grinding step is carried out on a region having a width $L_2$ taken from said edge of the zone at the perimeter, such that $L_1>L_2$.

9. The trimming method according to claim 8, wherein the widths $L_1$ and $L_2$ are between 1 mm and 5 mm.

10. The trimming method according to claim 1, further comprising, after the stopping of the trimming, a step of cleaning by wet etching, for example so as to remove a remaining part of the zone at the perimeter.

11. The trimming method according to claim 1, further comprising, after the stopping of the trimming, a step of cleaning by dry etching, for example so as to remove a remaining part of the zone at the perimeter.

12. The trimming method according to claim 1, wherein the transition layer is made of a material taken among: a silicon oxide, alumina, diamond[_[,]] and silicon nitride, and wherein the wafer is made of at least one material taken among: silicon, germanium, a III/V material, a II/VI material and silicon carbide.

13. The trimming method according to claim 1, wherein the transition layer is selected to have a thickness of between 0.5 μm and 10 μm.

* * * * *